United States Patent
Boston (10) Patent No.: US 9,532,477 B2
(45) Date of Patent: Dec. 27, 2016

(54) DATA RACK SUPPORT AND WIRE MANAGEMENT SYSTEM AND METHODS FOR USING THE SAME

(71) Applicant: SIEMENS INDUSTRY, INC., Alpharetta, GA (US)

(72) Inventor: Donald Carey Boston, Arlington, TX (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days.

(21) Appl. No.: 14/717,316

(22) Filed: May 20, 2015

(65) Prior Publication Data

US 2016/0345457 A1    Nov. 24, 2016

(51) Int. Cl.
| | |
|---|---|
| H02B 1/015 | (2006.01) |
| H02B 1/42 | (2006.01) |
| H05K 7/14 | (2006.01) |
| H02B 1/48 | (2006.01) |
| H02J 13/00 | (2006.01) |
| H01R 13/68 | (2011.01) |
| G01R 1/04 | (2006.01) |
| H01R 25/00 | (2006.01) |
| G01R 15/18 | (2006.01) |
| H01H 73/38 | (2006.01) |
| H02B 1/056 | (2006.01) |

(Continued)

(52) U.S. Cl.
CPC ...... *H05K 7/14* (2013.01); *G01R 1/04* (2013.01); *G01R 11/04* (2013.01); *G01R 15/186* (2013.01); *H01H 73/38* (2013.01); *H01R 13/68* (2013.01); *H01R 25/00* (2013.01); *H02B 1/00* (2013.01); *H02B 1/056* (2013.01); *H02B 1/42* (2013.01); *H02B 1/48* (2013.01); *H02J 13/001* (2013.01)

(58) Field of Classification Search
CPC ......... G01R 1/04; G01R 15/186; G01R 11/04; H02J 13/001; H01R 13/68; H01R 25/00; H02B 1/056; H02B 13/68; H02B 1/00; H02B 1/42; H02B 1/48; H01H 73/38; H05K 7/14
USPC ....... 361/601, 622, 623, 627, 636, 641, 644, 361/657, 663; 174/17 R, 17.08, 520, 535
See application file for complete search history.

(56) References Cited

U.S. PATENT DOCUMENTS

| | | | |
|---|---|---|---|
| 5,892,449 A * | 4/1999 | Reid .................... | H02J 13/001 324/424 |
| 6,990,393 B2 * | 1/2006 | Parker ................. | F16K 37/0075 137/624.11 |

(Continued)

*Primary Examiner* — Anatoly Vortman (57) ABSTRACT

Embodiments of a data rack assembly for an electrical panel are provided. The electrical panel comprises a housing with a panelboard operatively connected to a live panel bus for distributing power to electrical components within the electrical panel. The electrical panel further includes a data rack assembly comprised of a lower bracket attached to an upper bracket. The lower bracket includes a pair of side walls defining a channel therebetween for accommodating and arranging one or more electrical wires, while the upper bracket includes a pair of support members for attaching the data assembly to the panelboard. A data carriage comprising slots for inserting data modules is also provided and attached to the upper bracket for creating monitoring points within the electrical panel. By arranging the electrical wires in the channel, additional space is available for installing additional data rack assemblies, thereby providing additional monitoring points.

20 Claims, 6 Drawing Sheets

(51) Int. Cl.
*H02B 1/00* (2006.01)
*G01R 11/04* (2006.01)

(56) References Cited

U.S. PATENT DOCUMENTS

| | | | | |
|---|---|---|---|---|
| 8,562,358 B2* | 10/2013 | Panella | ............... | H04L 41/12 439/49 |
| 2005/0033479 A1* | 2/2005 | Parker | ............... | F16K 37/0075 700/282 |
| 2006/0274481 A1* | 12/2006 | Nelson | ............... | G01R 15/186 361/600 |
| 2013/0108027 A1* | 5/2013 | Kioski | ............... | H04Q 1/15 379/27.05 |
| 2014/0218882 A1* | 8/2014 | Sandberg | ............... | G01R 1/04 361/760 |

* cited by examiner

DATA RACK SUPPORT AND WIRE MANAGEMENT SYSTEM AND METHODS FOR USING THE SAME

TECHNICAL FIELD

Aspects of the present invention relate generally to electrical panels, and more particularly, to data rack assemblies for arranging wires within the electrical panels.

BACKGROUND

Electrical panels, e.g., lighting panels or switchboards, generally include a housing defining a unit space for enclosing a plurality of electrical components therein. The electrical components, for example, data modules that create monitoring points, require large amounts of twisted wire pairs connected to current transformers for relaying information in the panel to a main controller. Because a large amount of wires are required, the amount of space available in the electrical panels is limited, which consequently limits the number of monitoring points in the panel. The limited number of monitoring points in the panel, forces a number of devices to be located outside the panel unit space, and subsequently limits the amount of application that can be run through the panel. Therefore, there remains a need to better manage the space occupied in the panel by the twisted wire pairs, thereby permitting additional monitoring points to be present in the panel, creating additional panel capabilities.

SUMMARY

In one embodiment, an electrical panel comprises a panel housing having a panelboard operably connected therein, and one or more data rack assemblies. The data rack assembly includes a lower bracket and an upper bracket. The lower bracket includes a base having a width and a length. The lower bracket further includes a first side wall extending upwardly from the base at least partially along the length, and a second side wall extending upwardly from the base at least partially along the base length. The first and second side walls define a channel for arranging one or more wires therebetween. The wires may be straight or twisted wires. The upper bracket selectively attached to the lower bracket. The upper bracket comprises an upper portion having width, a length, and a first side. The upper bracket further includes a means for attaching the data rack assembly to the panelboard operably connected to the upper portion. Additionally, the data rack assembly includes a data carriage selectively attached to the first side of the upper portion. The data carriage includes one or more slots that are adapted to at least partially receive one or more data modules therein.

DETAILED DESCRIPTION

Figure 1:
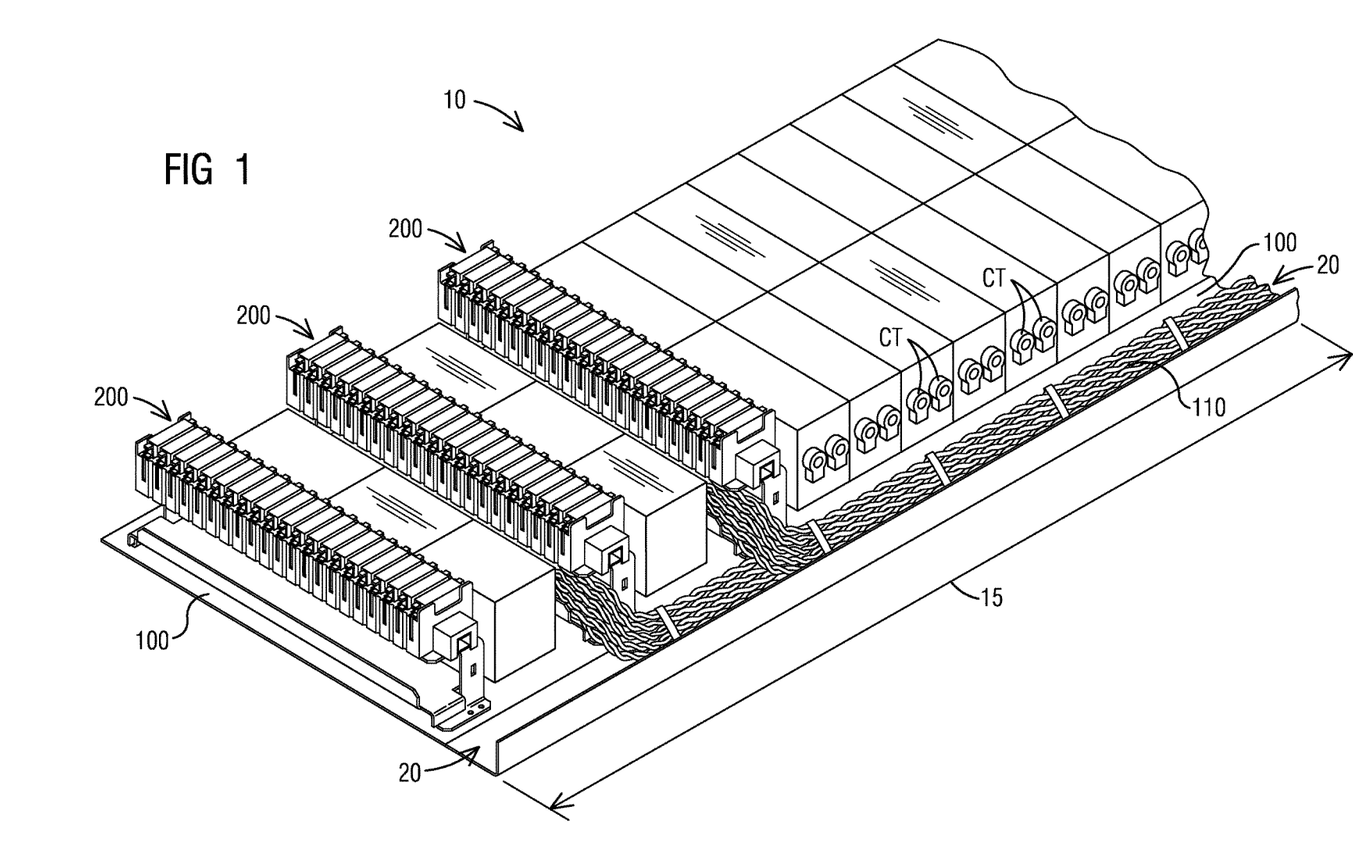
FIG. 1 illustrates a perspective view of an electrical panel having one or more data rack assemblies, in accordance with an exemplary embodiment of the present invention.

Referring now to the drawings wherein the showings are for purposes of illustrating embodiments of the subject matter herein only and not for limiting the same, FIG. 1 illustrates a perspective view of an electrical panel 10 comprising a panelboard 100 and data rack assembly 200 in accordance with the disclosure provided herein. Exemplary embodiments of the electrical panel 10 may be, e.g., a lighting panel, switchboard, or similar control panel for providing administrators the ability to determine, monitor and/or control resource allocation throughout or between one or more infrastructures, e.g., a building. The electrical panel 10 may generally include a housing or enclosure defining one or more spaces for at least partially enclosing one or more electrical components therein, including the panelboard 100. The enclosure may be formed by a plurality of frames operably connected together via a fastening means, for example, thereby defining the one or more spaces for enclosing the electrical components. In one embodiment, the enclosure may define a first incoming space (not shown). The incoming space may house, e.g., one or more lugs for receiving wires operably connected to the electrical components, and one or more breakers e.g., a main breaker, for facilitating the distribution of power throughout the electrical panel 10. The enclosure may further include a second unit space 15. The second unit space 15 may be generally located in a middle portion of the electrical panel 10, and may include one or more circuit breakers and switches. Additionally, the unit space 15 may include one or more current transformers CT, and the data rack assembly 200. The electrical panel 10 may further include a gutter space 20 extending along the length of the electrical panel 10 enclosure. The gutter space 20 may extend across multiple spaces defined within the enclosure e.g., the incoming and unit space 15, and may be adapted for arranging one or more of the electrical wires running throughout the electrical panel 10. The gutter space 20 may be arranged on one side of the electrical panel 10, or in a further embodiment, where multiple gutter spaces 20 are warranted, on opposed sides of the electrical panel 10. In yet a further embodiment, the electrical panel 10 may include a third controlled space (not shown). The third controlled space may include any of the components included in the first and second spaces above, e.g., circuit breakers, switches etc. Additionally, the third controlled space may include one or more sensors (e.g., ground fault sensors) operable to protect the electrical panel 10 from any fault occurrences. Additional lugs may also be provided in the third controlled space for feeding one or more electrical components, e.g., wires, to any adjacent electrical panels 10.

The fastening means may be, for example, one or more screws, nuts and bolts, or rivets applied via mechanical fastening process through one or more apertures and/or connecting points of the panels, frames and/or assemblies disclosed herein. The fastening means may further be one or more clips, e.g., a u-clip, fascia clip, or the like, or any other clips and or fasteners known to persons having ordinary skill in the art and capable of selectively connecting any of the panels, frames and/or assemblies disclosed herein. Alternatively, the fastening means may be applied via a more permanent-like mounting process, e.g., welding. A combination of both processes may also be used to achieve the desired arrangement for enclosure of the electrical panel 10, or any other arrangements disclosed herein.

The panelboard 100 may include one or more contact points corresponding to the electrical components operably connected thereto. Examples of the electrical components may include one or more controllers which may facilitate the exchange of data/information between the electrical components and/or one or more external components; one or more fuses and/or circuit breakers which may facilitate the operability of the electrical components and the distribution of current through the electrical panel 10; electrical wiring 110, e.g., twisted wired pairs, for facilitating the transmission of data/information and/or distributing current throughout the electrical panel 10; one or more relays for relaying information in the panel via one or current transformers (CT), which are operably connected to the panelboard 100; and one or more data modules 300 for creating monitoring points within the panelboard 100, or any combinations thereof. The panelboard 100 may further be operably connected to one or more live panel buses (not shown) for providing current to the one or more electrical components in the electrical panel 10.

Figure 2:
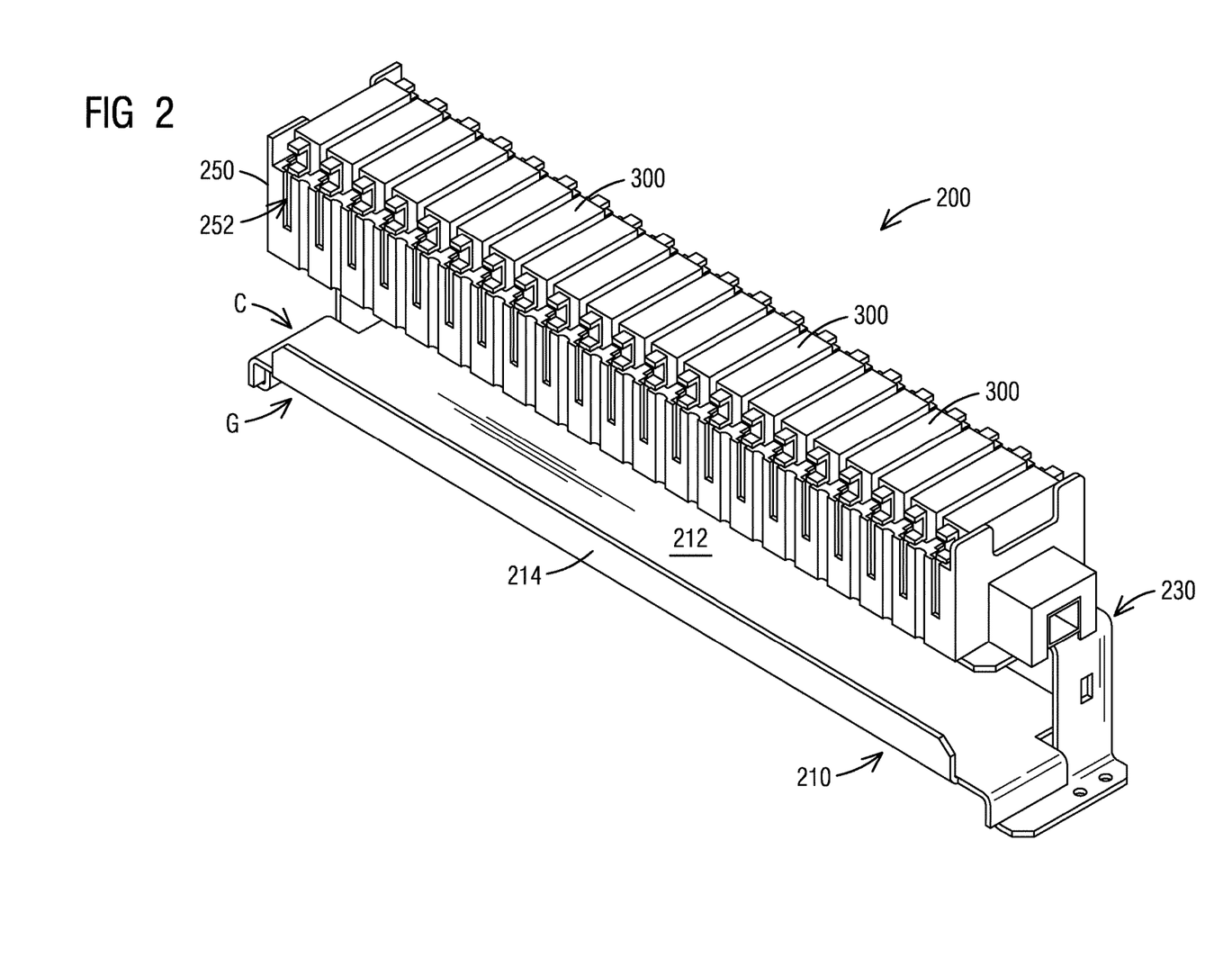
FIG. 2 illustrates a perspective view of the data rack assembly with a plurality of data modules, in accordance with an exemplary embodiment of the present invention.
Figures 3A, 3B:
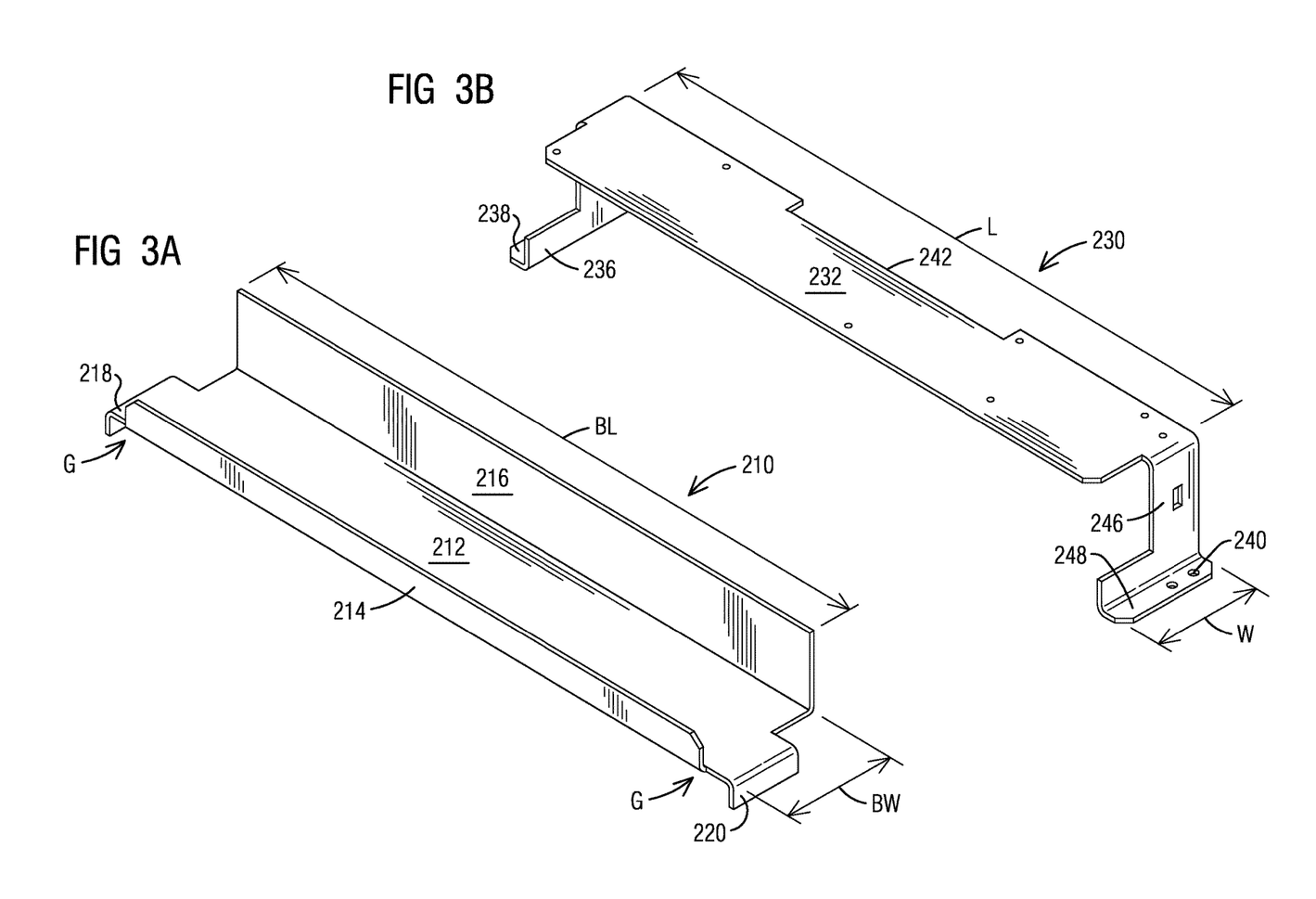
FIG. 3A illustrates a perspective view of a lower panel of the data rack assembly, in accordance with an exemplary embodiment of the present invention.
FIG. 3B illustrates a perspective view of an upper panel of the data rack assembly, in accordance with an exemplary embodiment of the present invention.

With reference to FIG. 2 and FIG. 3A, the electrical panel 10 may further include one or more data rack assemblies 200 operably connected to the panelboard 100 for at least partially supporting one or more of the electrical components, e.g., the data modules 300 via a data carriage 250, and for providing a wire-way or channel C for arranging the electrical wires 110 operably connected to the data modules 300. The data rack assembly 200 may include a lower bracket 210 selectively attached to an upper bracket 230. The lower bracket 210 may be made of a polymer material, or any other non-conductive heat resistance material known to persons having ordinary skill in the art. In an exemplary embodiment, the lower bracket 210 may include a base portion 212 having a width BW and length BL, and a first side wall 214 opposite a second side wall 216 defining the channel C. The channel C may have a width, i.e., the distance between the first 214 and second 216 side walls, equal to or less than the width BW of the base portion 212. In one embodiment, the channel C width may be between 1 and 5 inches. In a further embodiment, the channel C width may be approximately 3 inches, or any distance chosen with sound judgment for providing space for arranging the electrical wires 110.

The first side wall 214 may extend in a substantially upwards direction from the base portion 212, and at least partially along the length BL. The second side wall 216 may have a similar configuration in that it may extend in a substantially upwards direction from the base portion 212, and at least partially along the length BL. In one embodiment, each of the side walls (214, 216) upward extension from the base portion 212 may be continuous along the length BL such that no break exists between the beginning and the end of the respective side walls. In a further embodiment, each side wall may have a castle-like shape (e.g., indentations) such that the upper portion of each side wall is not continuous from the beginning to the end of the side walls, or alternatively varies in height along the length BL.

In one embodiment, the first side wall 214 and the second side wall 216 may be individual pieces separate from the base portion 212, and selectively attached to the base portion via a fastening means as described herein. Additionally, the first side wall 214 and the second side wall 216 may be integrally formed with the base portion 212. As used herein, integrally formed means to couple such that the pieces are relatively permanently joined. In a further embodiment, the first side wall 214 and the second side wall 216 may be formed from the same piece of material as the base portion 212. In this embodiment, the base portion 212 may include one or more bends, i.e., bent portions, defining the first side wall 214 and second side wall 216. The upward extension for the first side wall 214 should be sufficient to provide a barrier/shield for the electrical wires 110 within the channel C, or to at least partially contain the electrical wires 110 within the channel C. The upward extension of the second wall 216 may be sufficient to facilitate connecting the lower bracket 210 to the upper bracket 230. In one embodiment, the height of upwards extension for both side wall (214, 216) from the base portion 212 may be different; however, a similar height may also be used.

The lower bracket 210 may further include a means for elevating the base portion 212 above the panelboard 100 resulting in a gap G between the base portion 212 and the panelboard 100, or any electrical components beneath the base portion 212. In one embodiment, the means for elevating the base portion 212 may be by one or more leg extensions extending in a substantially downward direction from the base portion 212. FIG. 2, e.g., illustrates a first leg extension 218 and an opposite second leg extension 220, both extending in a substantially downward direction from the base portion 212 and at least partially along the width BW. In one embodiment, the first leg extension 218 and the second leg extension 220 may be individual pieces separate from the base portion 212, and selectively attached to the base portion via a fastening means as described herein. Additionally, the first leg extension 218 and the second leg extension 220 may be integrally formed with the base portion 212. In a further embodiment, the first leg extension 218 and the second leg extension 220 may be formed from the same piece of material as the base portion 212. In this embodiment, the base portion 212 may include one or more bends, i.e., bent portions, defining the first leg extension 218 and the second leg extension 220. In a further embodiment, the means for elevating the base portion 212 may be by one or more washers and/or spacers selectively attached to the base portion 212 for providing the desired gap G below the base portion 212.

The distance defining the gap G between the base portion 212 and any other material/component(s) within the electrical panel 10 may be, for example, between 0.1 inch and 3 inches. In one embodiment, where the lower bracket 210 may comprise a non-conductive material, the gap G may be at least 0.25 inch. In a further embodiment, e.g., where the lower bracket 210 comprises a conductive material, the gap G may be at least 1 inch, or any distance chosen with sound judgment for providing space between the base portion 212 and any other materials/components, e.g., the live panel bus, beneath the base portion 212.

With continue reference to the FIGS. 1-3A, and now FIG. 3B, the upper bracket 230 may include an upper portion 232 having a first side 234, a width W and a length L. The upper bracket 230 may be made of a similar material to that of the lower bracket 210, or any other material known to persons of ordinary skill in the art capable of supporting any assemblies and/or structures mounted thereon. The upper bracket 230 may further include a means for attaching the data rack assembly 200 to the panelboard 100 or within the electrical panel 10, e.g., to one or more rails. In one embodiment, the means for attaching the data rack assembly 200 may be a first support member 236 and an opposite second support member 246, extending in a substantially downward direction from the upper portion 232 at least partially along the width W. The first support member 236 may include an extension 238 having one or more fastening apertures 240 for receiving a fastening means therebetween for removably securing the data rack assembly 200 within the electrical panel 10. Similarly, the second support member 246 may also include an extension 248 having one or more fastening apertures 240 for receiving a fastening means therebetween for removably securing the data rack assembly 200 within the electrical panel 10.

In one embodiment, the means for attaching the data rack assembly 200, e.g., the first support member 236 and second support member 246, may be individual pieces separate from the upper portion 232 and selectively attached to the upper portion 232 via a fastening means as described herein. Additionally, the means for attaching the data rack assembly 200 may be integrally formed with the upper portion 232. In a further embodiment, the means for attaching the data rack assembly 200, e.g., the first support member 236 and second support member 246, may be formed from the same piece of material as the upper portion 232. In this embodiment, the upper portion 232 may include one or more bends, i.e., bent portions, defining the first support member 236 and second support member 246.

The upper portion 232 may further include a means for attaching the upper bracket 230 to the lower bracket 210. In one embodiment, the means for attaching the upper bracket 230 to the lower bracket 210 may be an upper portion side wall 242 extending in a substantially downward direction from the upper portion 232 at least partially along its length L. In another embodiment, the means for attaching the upper bracket 230 to the lower bracket 210 may be via one or more brackets, e.g., an L-shape bracket, selectively attached to the upper bracket 230 and lower bracket 210 via a fastening means as described herein for connecting the same. A combination of both the upper portion side wall 242 and one or more brackets may also be used for selectively attaching the upper bracket 230 to the lower bracket 210. In an embodiment where the upper portion side wall 242 attaches the upper bracket 230 to the lower bracket 210, the upper portion side wall 242 may include one or more apertures aligned with or corresponding to one or more apertures of the second side wall 216 of the lower bracket 210, for at least partially receiving one or more fasteners therebetween for selectively attaching the brackets. The upper portion side wall 242 may be an individual piece separate from the upper portion 232 and attached thereto via a fastening means. Alternatively, the upper portion side wall 242 may be integrally formed with the upper portion 232, or be made from the same piece of material as the upper portion 232. In an embodiment where the upper portion 232 and the upper portion side wall 242 are made from the same piece of material, the upper portion 232 may include one or more bends, i.e., bent portions, defining the upper portion side wall 242. Upon attaching the lower bracket 210 to the upper bracket 230, the distance between the upper portion 232 and the base portion 212 may be such that the upper portion 232 does not substantially obstruct the arrangement of the electrical wires 110 in the channel C.

Figure 4:
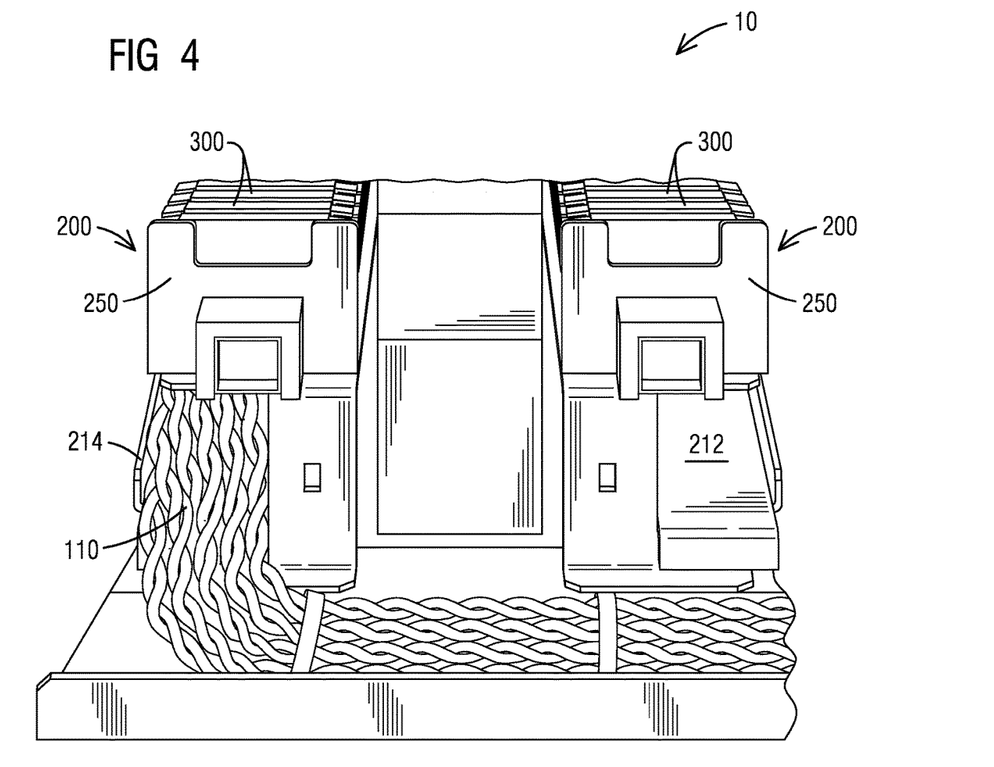
FIG. 4 illustrates a perspective side view of the electrical panel and data rack assembly of FIG. 1, in accordance with an exemplary embodiment of the present invention.
Figure 5:
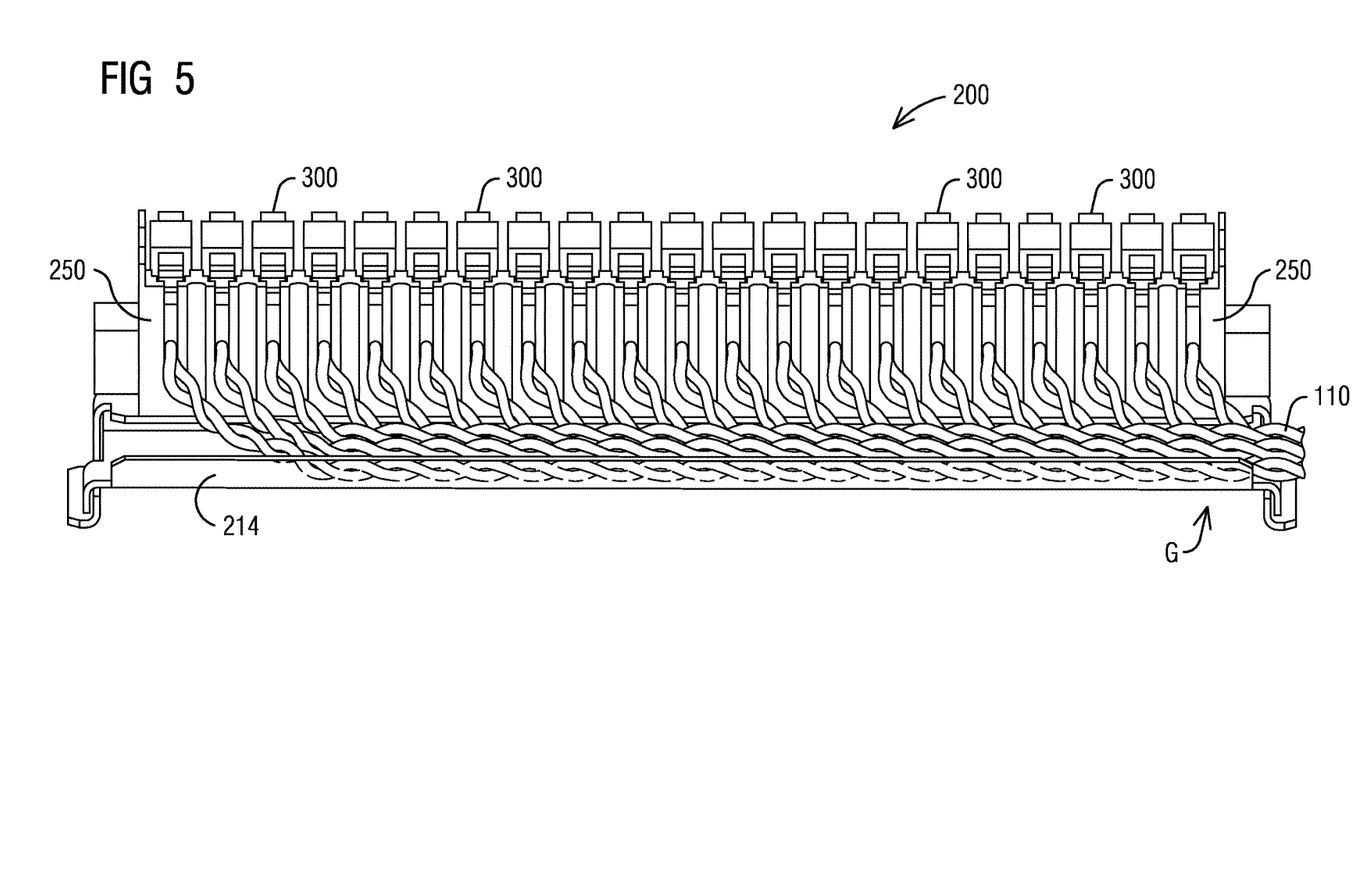
FIG. 5 illustrates a perspective front view of the electrical panel and data rack assembly of FIG. 1, in accordance with an exemplary embodiment of the present invention.

With continued reference to FIG. 2, and now FIG. 4 and FIG. 5, the data rack assembly 200 may further include one or more data rack carriages 250 selectively attached to the upper bracket 230. In one embodiment, the data rack carriages 250 may be attached to the first side 234 via a fastening means as described herein, e.g., one or more clips extending through one or more apertures in the first side 234. The data rack carriages 250 may include one or more slots 252 adapted to at least partially receive one or more data modules 300 therein, and one or more grooves adapted to accommodate the electrical wires 110 operably connected to the data modules 300.

Figure 6:
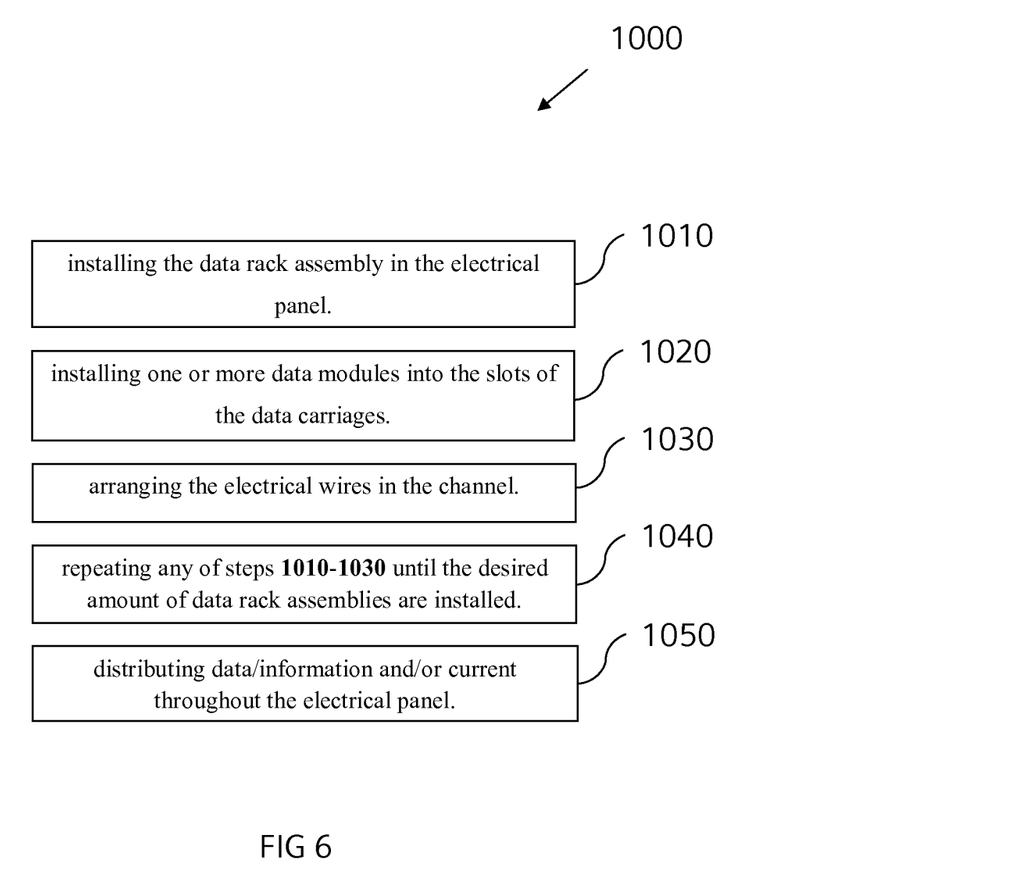
FIG. 6 illustrates a method for servicing an electrical panel, in accordance with an exemplary embodiment of the present invention.

It should be appreciated that following steps are not required to be performed in any particular order, and are hereby provided for exemplary purposes. For example, steps for installing the data modules 300 may not be necessary where the data modules 300 have previously been installed, and/or where the data rack assembly 200 is being removed from the electrical panel 10. With reference now to FIG. 6, an embodiment of a method 1000 for servicing an electrical panel 10 is provided. In step 1010, installing the data rack assembly 200 in the electrical panel 10. In this step, the data rack assembly 200 may be already assembly, in that the lower bracket 210 and the upper bracket 230 may have previously been attached to one another. Additionally, the data carriage 250 may already be attached to the first side 234 of the upper portion 232. In this embodiment, the assembled data rack assembly 200 may be placed into the electrical panel 10, and one or more fastening means may then be used, e.g., inserted into one or more apertures 240 of the extensions (238, 248) to selectively attach the data rack assembly 200 to either the panelboard 100, the electrical panel 10, or both.

In step 1020, installing one or more data modules 300 into the slots 252 of the data carriages 250. In this step, the data modules 300 may be placed into the slots 252 and operably connected to one or more corresponding current transformers CT via one or more electrical wires 110. The electrical wires 110 may have previously been connected to the data modules 300, or be connected once the data modules 300 are secured in the slots 252. In step 1030, arranging the electrical wires 100 in the channel C. In this step, the electrical wires 110 may be arranged or situated in the channel C in a substantially uniform or non-uniform manner, such that the electrical wires 110 don't substantially interfere with additional electrical wires 110 within the electrical panel 10 or neighboring data rack assemblies 200. The side walls (214, 216) may assist in containing or shielding the electrical wires 110 from extending or flexing beyond the channel C. Additionally, one or more clips or ties may be use to further secure the electrical wires 110 within the channel C, to one of the side walls (e.g., 214, 216), or other structure within the electrical panel 10.

In step 1040, repeating any of steps 1010-1030 until the desired amount of data rack assemblies 200 are installed in the electrical panel 10, and if desired, subsequently enclosing (partially or fully) the electrical components within the electrical panel 10 e.g., by a door or other panel-like structure. In step 1050, distributing data/information and/or current throughout the electrical panel 10. In this step, one or more live panel buses may be operably connected to the panelboard 100, such that data/information and/or current may be distributed to one or more electrical components of the electrical panel 10, and in certain exemplary embodiments, to one or more components external components and/or devices. In yet a further embodiment, if may be necessary to remove any existing electrical components e.g., data modules 300 and/or electrical wires 110 prior to step 1010. In this embodiment, removing the existing electrical components may be needed to prep the panelboard 100 and/or electrical panel 10 prior to installing the data rack assembly 200. This preparation step may facilitate retrofitting the electrical panel 10 with one or more data rack assemblies 200 according to any of the embodiments disclosed herein.

While specific embodiments have been described in detail, those with ordinary skill in the art will appreciate that various modifications and alternative to those details could be developed in light of the overall teachings of the disclosure. For example, elements described in association with different embodiments may be combined. Accordingly, the particular arrangements disclosed are meant to be illustrative only and should not be construed as limiting the scope of the claims or disclosure, which are to be given the full breadth of the appended claims, and any and all equivalents thereof. It should be noted that the terms "comprising", "including", and "having", are open-ended and does not exclude other elements or steps; and the use of articles "a" or "an" does not exclude a plurality.

I claim:

1. A data rack assembly for use in an electrical panel comprising:
   a lower bracket comprising a base having a base width and a base length, and a first side wall extending upwardly from the base at least partially along the base length, and a second side wall extending upwardly from the base at least partially along the base length, wherein the first side wall and the second side wall define a channel for arranging one or more wires therebetween;
   an upper bracket attached to the lower bracket, the upper bracket comprising an upper portion having an upper portion width, an upper portion length, a first side, and a means for attaching the data rack assembly in the electrical panel.

2. The assembly of claim 1 further comprising:
   a data carriage attached to the first side of the upper portion, the data carriage comprising one or more slots adapted to at least partially receive one or more data modules therein.

3. The assembly of claim 1, wherein the means for attaching the data rack assembly is a first support member extending downwardly from the upper portion at least partially along the upper portion width, and a second support member opposite the first support member, the second support member extending downwardly from the upper portion at least partially along the upper portion width.

4. The assembly of claim 3, wherein the first support member and the second support member each include an extension having one or more fastening apertures adapted to receive a second fastening means therebetween for attaching the data rack assembly in the electrical panel.

5. The assembly of claim 1, wherein the lower bracket further comprises a means for elevating the base above one or more components in the electrical panel.

6. The assembly of claim 5, wherein the means for elevating the base is a pair of leg extensions extending in a downward direction from the base at least partially along the base width at opposite ends, the pair of leg extensions defining a gap between the base and the one or more components in the electrical panel.

7. The assembly of claim 6, wherein the gap is between 0.1 inch and 1 inch.

8. The assembly of claim 1, wherein the first side wall and the second side wall are integrally formed with the base.

9. The assembly of claim 3, wherein the first support member and the second support member are integrally formed with the upper portion.

10. The assembly of claim 1, wherein the first side wall height differs from the second side wall height.

11. An electrical panel comprising:
   a panelboard; and
   a data rack assembly comprising:
      a lower bracket including a base having a base width and a base length, and a first side wall extending upwardly from the base at least partially along the base length, and a second side wall extending upwardly from the base at least partially along the base length, wherein the first side wall and the second side wall define a channel for arranging one or more wires therebetween;
      an upper bracket attached to the lower bracket, the upper bracket comprising an upper portion having a first side, an upper portion width, and an upper portion length, and a means for attaching the data rack assembly to the panelboard; and
      a data carriage attached to the first side of the upper portion, the data carriage comprising one or more slots adapted to at least partially receive one or more data modules therein.

12. The panel of claim 11 further comprising: one or more data modules operably attached to the one or more slots of the data carriage.

13. The panel of claim 11, wherein the means for attaching the data rack assembly is a first support member extending downwardly from the upper portion at least partially along the upper portion width, and a second support member extending downwardly from the upper portion at least partially along the upper portion width, wherein the first support member and the second support member are at opposite ends of the upper portion.

14. The panel of claim 13, wherein the first support member, the second support member, and the upper portion are formed from the same piece of material.

15. The panel of claim 13, wherein the first side wall, the second side wall, and the base are formed from the same piece of material.

16. The panel of claim 11, wherein the lower bracket further comprises a means for elevating the base above one or more components in the electrical panel.

17. The panel of claim 16, wherein the means for elevating the base is a pair of leg extensions extending in a downward direction from the base at least partially along the base width at opposite ends, the pair of leg extensions defining a gap between the base and the one or more components in the electrical panel.

18. The panel of claim 17, wherein the gap is between 0.1 inch and 3 inches.

19. A method for assembling an electrical panel, comprising:
   installing the data rack assembly of claim 2 into the electrical panel via the means for attaching the data rack assembly;
   inserting one or more data modules in the one or more slots of the data carriage; and
   operably connecting one or more electrical wires to the one or more data modules for creating additional monitoring points.

20. The method of claim 19 further comprising the step of:
prior to installing the data rack assembly, removing one or more electrical components to prep the panelboard for operably connecting the data rack assembly thereto.

* * * * *